US010833675B2

(12) United States Patent
Gambuzza et al.

(10) Patent No.: US 10,833,675 B2
(45) Date of Patent: Nov. 10, 2020

(54) OPTICALLY ISOLATED LATCHING SOLID STATE RELAY WITH LOW ON RESISTANCE AND LINEAR OPERATION

(71) Applicant: Littelfuse, Inc., Chicago, IL (US)

(72) Inventors: Michael J. Gambuzza, Boston, MA (US); Eirik L. Gude, Lexington, MA (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 16/706,531

(22) Filed: Dec. 6, 2019

(65) Prior Publication Data

US 2020/0112309 A1    Apr. 9, 2020

Related U.S. Application Data

(63) Continuation of application No. 16/104,920, filed on Aug. 19, 2018, now Pat. No. 10,523,198.

(51) Int. Cl.
*H03K 17/689* (2006.01)
(52) U.S. Cl.
CPC .................. *H03K 17/689* (2013.01)
(58) Field of Classification Search
CPC ..................................................... H03K 17/689

USPC .......................... 327/427, 434, 437, 108–112
See application file for complete search history.

(56) References Cited

U.S. PATENT DOCUMENTS

| | | | |
|---|---|---|---|
| 4,801,821 A | 1/1989 | Prevost et al. | |
| 2004/0222701 A1 | 11/2004 | Kugelman | |
| 2006/0245129 A1 | 11/2006 | Bamburak | |
| 2013/0234779 A1* | 9/2013 | Klug, Jr. | .......... H03K 17/04123 327/432 |

\* cited by examiner

*Primary Examiner* — Tomi Skibinski

(57) ABSTRACT

A latching relay includes a supply terminal, a load terminal, first and second coupling circuits, a latch circuit, first and second transistors, and a local supply node coupled to a capacitor. In one example, the supply terminal is coupled to a supply node and the load terminal is coupled to the load. The first and second transistors control the conductivity of a drive transistor coupled to the load. A microcontroller controls the latching relay to switch the load on and off. To enable the load, the microcontroller sinks current from the supply terminal and through the first coupling circuit. While the load is enabled, the capacitor is discharged. The latching relay is operable in a refresh mode in which current is pulsed through the first coupling circuit causing capacitor to be re-charged from the supply terminal. To disable the load, the microcontroller sinks current through the second coupling circuit.

12 Claims, 11 Drawing Sheets

LATCHING RELAY

SOLID STATE LATCHING RELAY COUPLED TO SWITCH LOAD

LATCHING RELAY

LATCHING RELAY
(TURN ON RELAY AND DRIVE CURRENT THROUGH LOAD)

LATCHING RELAY
(ENABLE REFRESH MODE TO REPLENISH EXTERNAL CAPACITOR)

LATCHING RELAY
(RESET AND DISABLE LOAD)

SOLID STATE LATCHING RELAY COUPLED TO LOAD SUPPLY
(NO REFRESH OR CAPACITOR REQUIRED)

SOLID STATE LATCHING RELAY COUPLED TO EXTERNAL DRIVE TRANSISTOR

OPTICALLY ISOLATED LATCHING SOLID STATE RELAY WITH LOW ON RESISTANCE AND LINEAR OPERATION

CROSS-REFERENCE TO RELATED APPLICATION

This application is a continuation of U.S. Non-Provisional patent application Ser. No. 16/104,920, filed Aug. 19, 2018, which application is incorporated by reference herein in its entirety.

TECHNICAL FIELD

The present invention relates generally to packaged electronic devices, and in particular to switching relays.

BACKGROUND INFORMATION

Latching relays are often used in switching applications to switch a load on and off. After switching on, the latching relay remains latched in the on state and maintains the load on until the latching relay is switched off. One common type of latching relay uses an electromagnet to mechanically operate a switch. These mechanical types of relays tend to be susceptible to damage. For example, impact due to dropping could damage the internal mechanical components of the relay making the relay inoperable. Another common type of switching relay is a solid-state relay. Conventional solid-state relays use Silicon-Controlled Rectifiers (SCRs) to switch the load on and to maintain the on state. These conventional solid-state relays usually require a separate supply to remain latched in the on state. In addition, conventional solid-state relays tend to have undesirable operating characteristics. A solution that overcomes these challenges is desired.

SUMMARY

A latching relay includes a supply terminal, a load terminal, first and second coupling circuits, a latch circuit, first and second transistors, and a local supply node coupled to a capacitor. The latching relay is a discrete packaged power semiconductor device having package terminals. The supply terminal and load terminal are package terminals of the latching relay. The latching relay is controlled by an external signaling mechanism, such as a microcontroller, to switch a load on, maintain the load in the on state, and then switch the load off. The supply terminal is coupled to a supply node and the load terminal is coupled to the load. The first and second transistors control the conductivity of a drive transistor coupled to the load. In one embodiment, the drive transistor is within the package of the latching relay, and in another embodiment, the drive transistor is outside the package of the latching relay.

The first and second coupling circuits involve any electromagnetic energy coupling method including optical, inductive, or capacitive. In one example, the first and second coupling circuits are optocoupler circuits that use optical coupling techniques. The first optocoupler includes a light emitting diode (LED) and a PhotoVoltaic Stack and Photo Diode (PVSPD) circuit. The PVSPD circuit includes a photovoltaic stack and a photo diode. The photovoltaic stack of the PVSPD circuit is used for enabling a refresh mode of the latching relay. The photodiode of the PVSPD circuit is used for turning on the latching relay. The second optocoupler circuit includes a LED and a photodiode circuit. The photodiode circuit of the second optocoupler is used to disable latching relay and switch off the load. The first and second optocoupler circuits ensure that a ground of the control side is isolated from a ground of the load side.

To enable the load, the microcontroller sinks current from the supply terminal and through the first optocoupler circuit. Sinking current through the first optocoupler circuit causes the LED of the first optocoupler circuit to radiate energy which is detected by the photodiode. The photodiode is enabled causing the latch circuit to switch digital logic levels output by the latch circuit. The outputs of the latch circuit in turn cause conductivity of the transistors to switch thereby controlling the drive transistor to turn on. Once the drive transistor is on, current flows from a positive terminal of the load supply, through the load, through the drive transistor and to a negative terminal of the load. The latching relay exhibits linear operating characteristics, unlike conventional latching relays that are realized using SCRs. In one example, the latching relay includes MOSFET transistors which exhibit more desirable linear operating characteristics as compared to SCRs.

In accordance with one novel aspect, the local supply node supplies circuitry within the latching relay. This circuitry includes the first and second optocoupler circuits, the latch circuit, and the transistors. The local supply node is supplied by the capacitor. When the latching relay is latched in the on state, the local supply node supplies the latching relay circuitry to maintain the on state without consuming energy from the load side because there is no voltage available when the drive transistor is in the on state. While the load is enabled, energy stored in the capacitor is consumed by the latching relay circuitry, including a gate of the drive transistor which maintains the load on. As energy stored in the capacitor decreases, a voltage on the local supply node begins to decrease. If the voltage on the local supply node were to decrease below a minimum operating voltage level, then the gate of the drive transistor would no longer be maintained thereby turning off the drive transistor. To avoid the voltage on the local supply node from undesirably decreasing below the minimum operating voltage level, the latching relay is operated in a refresh mode to refresh the capacitor and to maintain the voltage on the local supply node above the minimum operating voltage level.

In the refresh mode, current is pulsed through the LED of the first optocoupler circuit. This causes a voltage to develop across the photovoltaic stack of the PVSPD circuit in the first optocoupler circuit. This voltage is used to charge the capacitor. In one embodiment, the capacitor is external to the package of the latching relay and the latching relay has a storage terminal that is coupled to a lead of the capacitor. In another embodiment, the capacitor is internal to the package of the latching relay and no storage terminal is included. In yet another embodiment, an additional load supply terminal is included in the packaged latching relay. If the load supply is accessible through the load supply terminal, then no capacitor or refresh mode is required because the load supply is used to maintain the local supply node above the minimum operating voltage level.

To disable the load, the microcontroller sinks current through the second optocoupler circuit. Sinking current through the second optocoupler circuit causes the LED of the second optocoupler circuit to radiate energy which is detected by the photodiode circuit. The photodiode circuit is enabled causing the latch circuit to be reset and causing outputs of the latch circuit to switch digital logic states. This in turn causes conductivity of the transistors to switch thereby pulling the gate of the drive transistor to ground and causing the drive transistor to turn off. Once the drive transistor is off, current stops flowing through the load and the load is switched off.

Further details and embodiments are described in the detailed description below. This summary does not purport to define the invention. The invention is defined by the claims.

BRIEF DESCRIPTION OF THE DRAWINGS

The accompanying drawings, where like numerals indicate like components, illustrate embodiments of the invention.

DETAILED DESCRIPTION

Reference will now be made in detail to some embodiments of the invention, examples of which are illustrated in the accompanying drawings.

Figure 1:
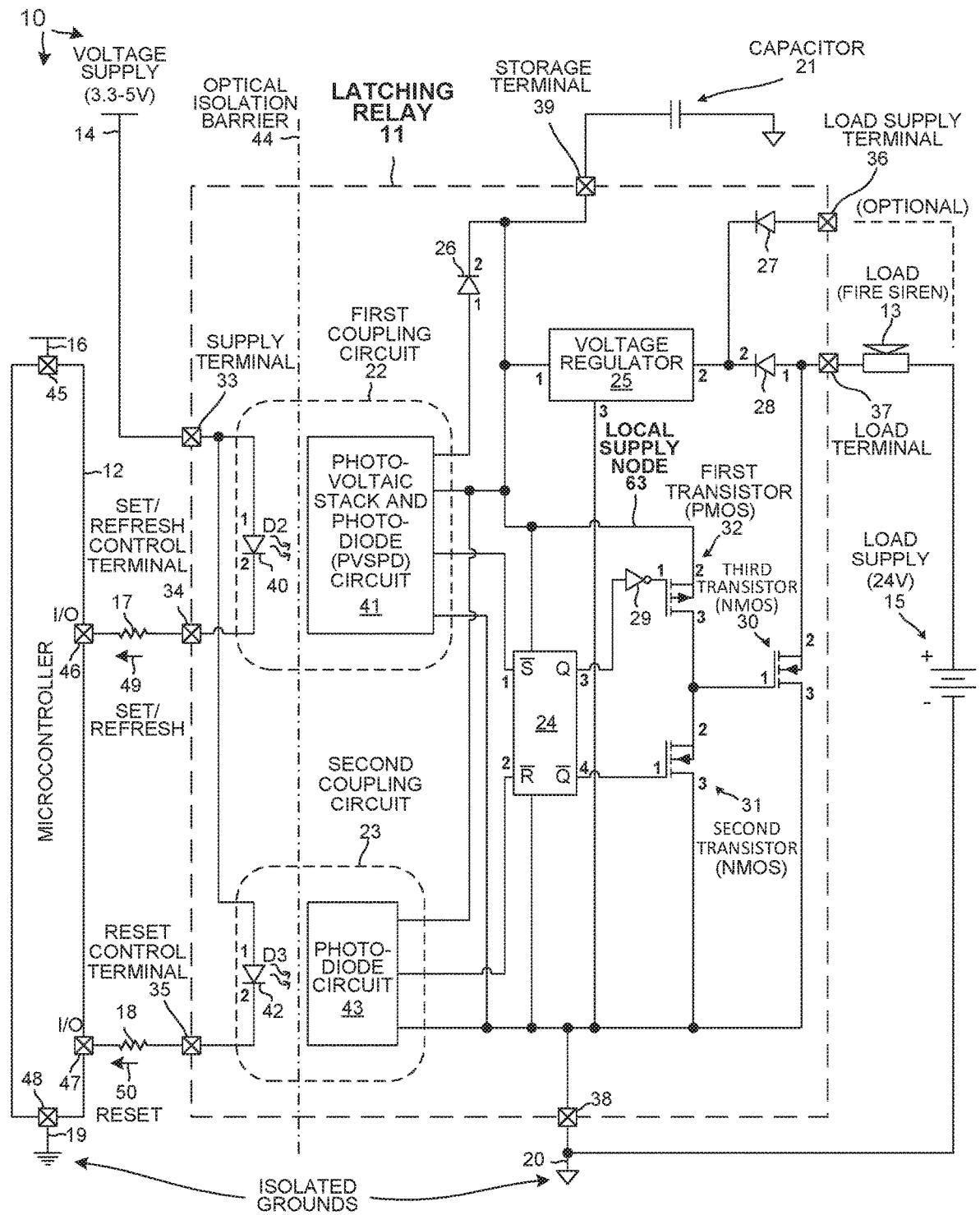
FIG. 1 is a diagram of a system 10 that includes a novel optically isolated latching solid state relay switching relay 11.

FIG. 1 is a diagram of a system 10 that includes a novel optically isolated latching solid state relay switching relay 11. The optically isolated latching solid state switching relay 11 is also referred to as a "switching relay". The system 10 comprises the switching relay 11, a microcontroller 12, a load 13, a voltage supply 14, a load supply 15, a microcontroller supply 16, resistor 17 and 18, first ground 19, second ground 20, and a capacitor 21. The switching relay 11 comprises a first coupling circuit 22, a second coupling circuit 23, an SR latch 24 ("latch circuit"), a regulator circuit 25, diodes 26-28, inverter 29, enhancement-mode, n-channel metal-oxide-semiconductor field effect transistors (MOSFETs) 30 and 31, enhancement-mode, p-channel MOSFET 32, an input voltage terminal 33, set/refresh control terminal 34, a reset control terminal 35, a load supply terminal 36, a load terminal 37, a ground (or return) terminal 38, and a storage terminal 39. MOSFET 30 is also referred to as a "drive transistor." In this example, capacitor is external to the latching relay 11, the regulator circuit 22 is a voltage regulator, the load 13 is a fire siren, the voltage supply 14 is a 3.3-5.0V battery, and the load supply 15 is a 24V battery.

The first and second coupling circuits 22 and 23 are realized using any coupling method including optical, inductive, or capacitive coupling. In the example of FIG. 1, the first and second coupling circuits 22 and 23 are optocouplers. The first optocoupler 22 comprises a Light Emitting Diode (LED) 40 and a photovoltaic stack and photodiode (PVSPD) circuit 41. The second optocoupler 23 comprises an LED 42 and a photodiode circuit 43. Reference numeral 44 identifies an optical isolation barrier formed by the first optocoupler 22 and the second optocoupler 23.

The microcontroller 12 comprises a supply terminal 45, control terminals 46 and 47, and a ground terminal 48. Details of the internal circuitry of the microcontroller is not shown and is omitted to simplify explanation. The supply terminal 45 receives an input supply voltage that supplies microcontroller 12. Microcontroller 12 generates and outputs a set/refresh control signal 49 onto the control terminal 46. Microcontroller 12 generates and outputs a reset control signal 50 onto the control terminal 47. In one example, microcontroller 12 is a Z32F128 ARM Cortex M3 commercially available microcontroller available for sale from Zilog, Inc. having an address of 1590 Buckeye Dr, Milpitas, Calif. 95035. In operation, the latching relay 11 is operable to switch current flow through the load 13 such that the microcontroller 12 selectively controls the load to switch on and off. Operation of the latching relay is explained in reference to FIGS. 3-7 below.

The capacitor 21 supplies circuitry of the latching relay via a local supply node 61 coupled to the storage terminal 39. The local supply node 61 is coupled to the voltage regulator 25, to a cathode terminal of the diode 26, to the first coupling circuit 22, to a terminal of the first transistor 32, and to the latch circuit 24. When the load is enabled, the capacitor 21 begins to drain and a voltage level on the local supply node 61 begins to decrease. To replenish the capacitor 21 and ensure that the voltage on the local supply node 61 is sufficient to supply circuitry of the latching relay, the microcontroller 12 controls the latching relay 11 in a refresh mode whereby current is pulsed through the supply terminal 33 and through the first coupling circuit 22. This pulsing of current through the first coupling circuit 22 causes the capacitor 21 to be re-charged. Although the capacitor 21 is shown external with respect to the latching relay 11, in other embodiments the capacitor 21 is internal to the latching relay 11 and no storage terminal, such as terminal 39, is provided.

Figure 2:
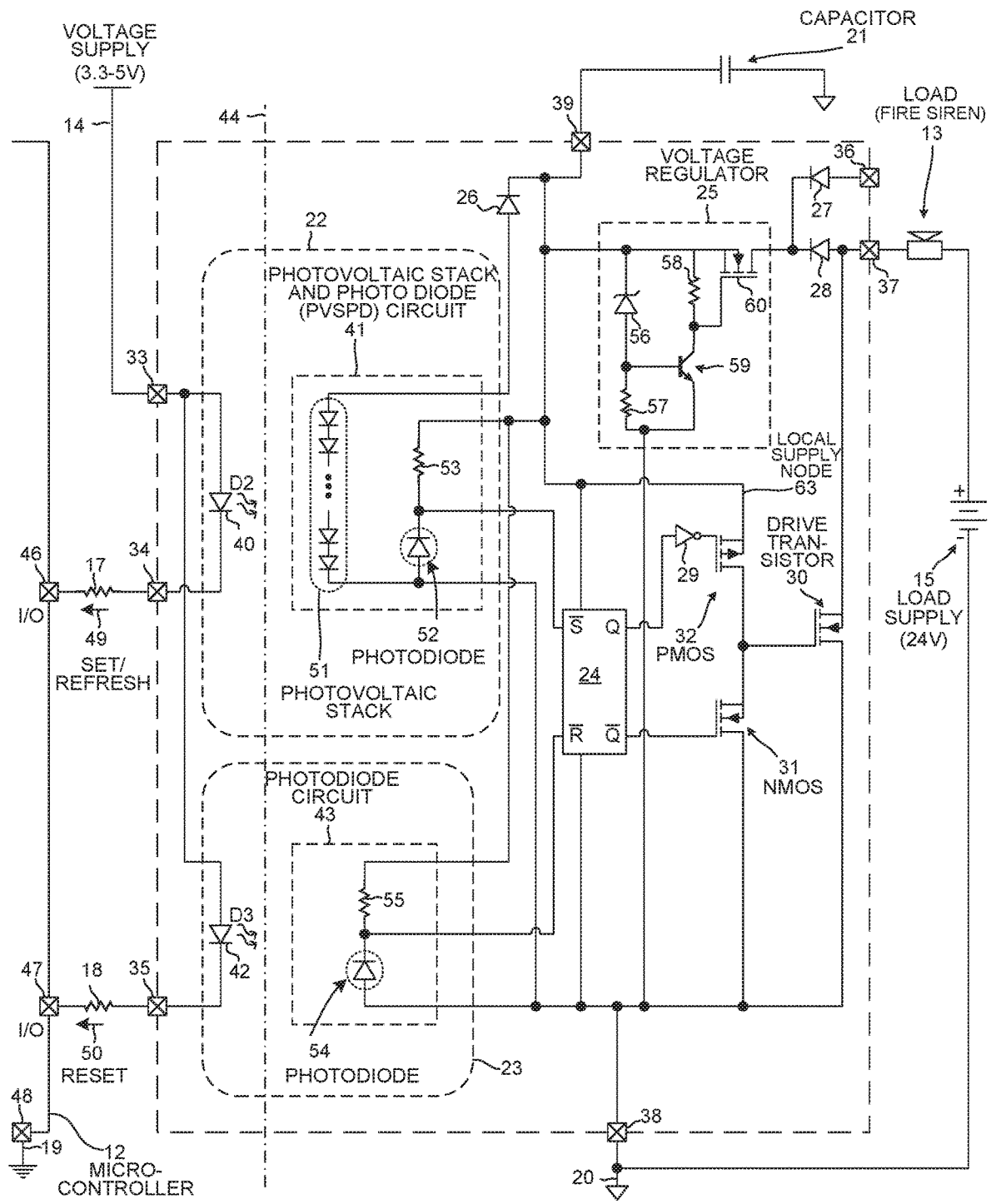
FIG. 2 is a detailed circuit diagram of the optically isolated latching solid state relay switching relay 11.

FIG. 2 is a detailed circuit diagram of the optically isolated latching solid state relay switching relay 11. The first optocoupler 22 comprises the LED 40 that controls the PVSPD circuit 41 by radiating energy. The PVSPD circuit 41 comprises a photovoltaic stack 51, a photodiode 52, and a resistor 53. The second optocoupler 23 comprises the LED 42 that controls the photodiode circuit 43 by radiating energy. The photodiode circuit 43 comprises a photodiode 54 and a resistor 55. The voltage regulator 25 comprises a Zener diode 56, resistors 57 and 58, a NPN bipolar junction transistor 59, and a depletion-mode, n-channel MOSFET 60.

Figure 3:
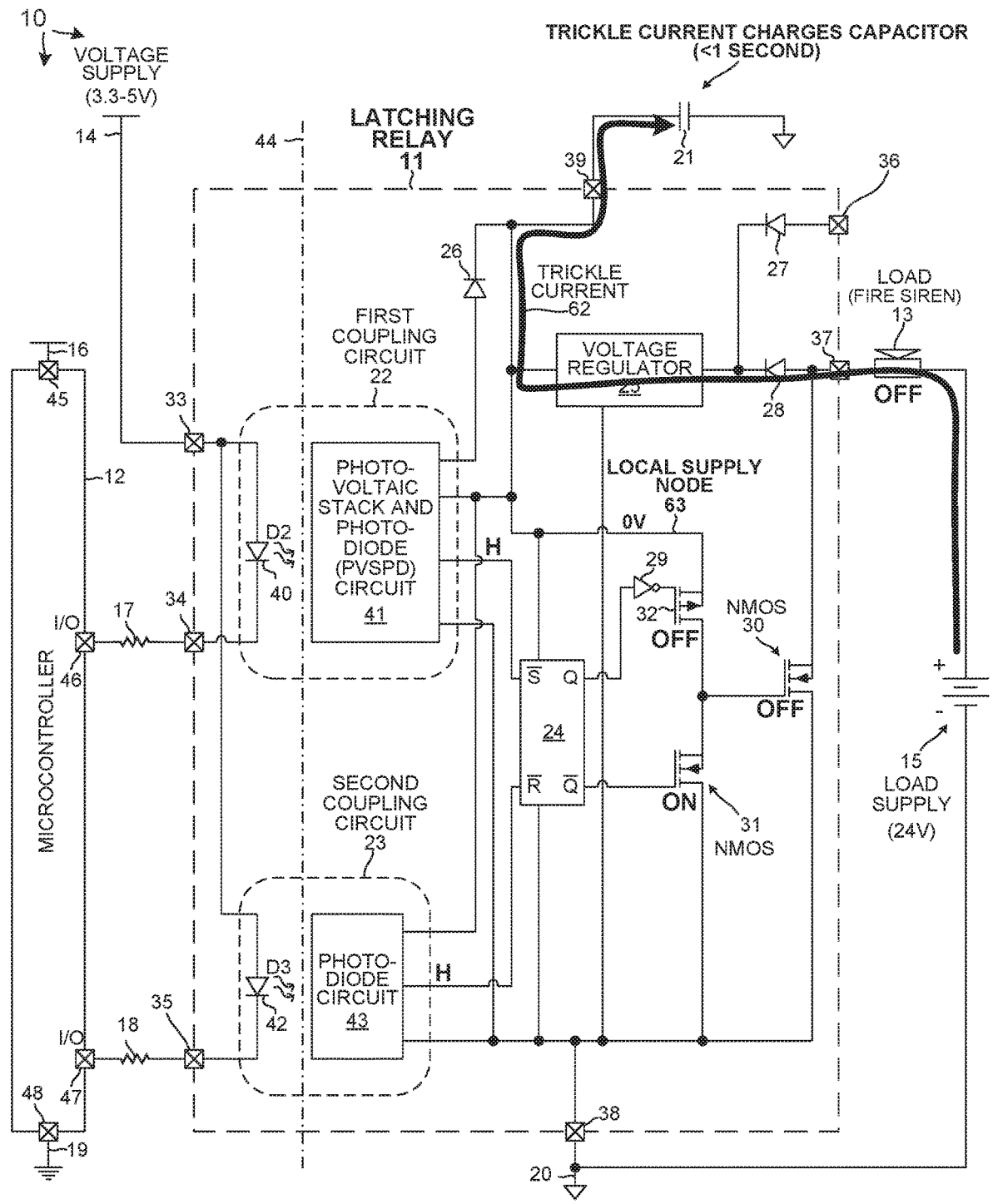
FIG. 3 is a circuit diagram showing initial connection of the latching relay 11 to the load 13 and microcontroller 12.

FIG. 3 is a circuit diagram showing initial connection of the latching relay 11 to the load 13 and microcontroller 12. The load 13 is initially off. No significant current is flowing through the load. After the initial connection, the capacitor 21 begins to charge from a current 62. The current 62 is of a minimal current level and does not have a sufficient current level to enable the load 13. The current 62 is also referred to as a "trickle current" or a "leakage current". In the example of FIG. 3, the trickle current 62 is less than 100 uA. The trickle current 62 flows through the load 13, through the load terminal 37, through diode 28, through voltage regulator 25, through the storage terminal 39, and onto a lead of the capacitor 21. The trickle current 62 charges capacitor 21.

Figure 4:
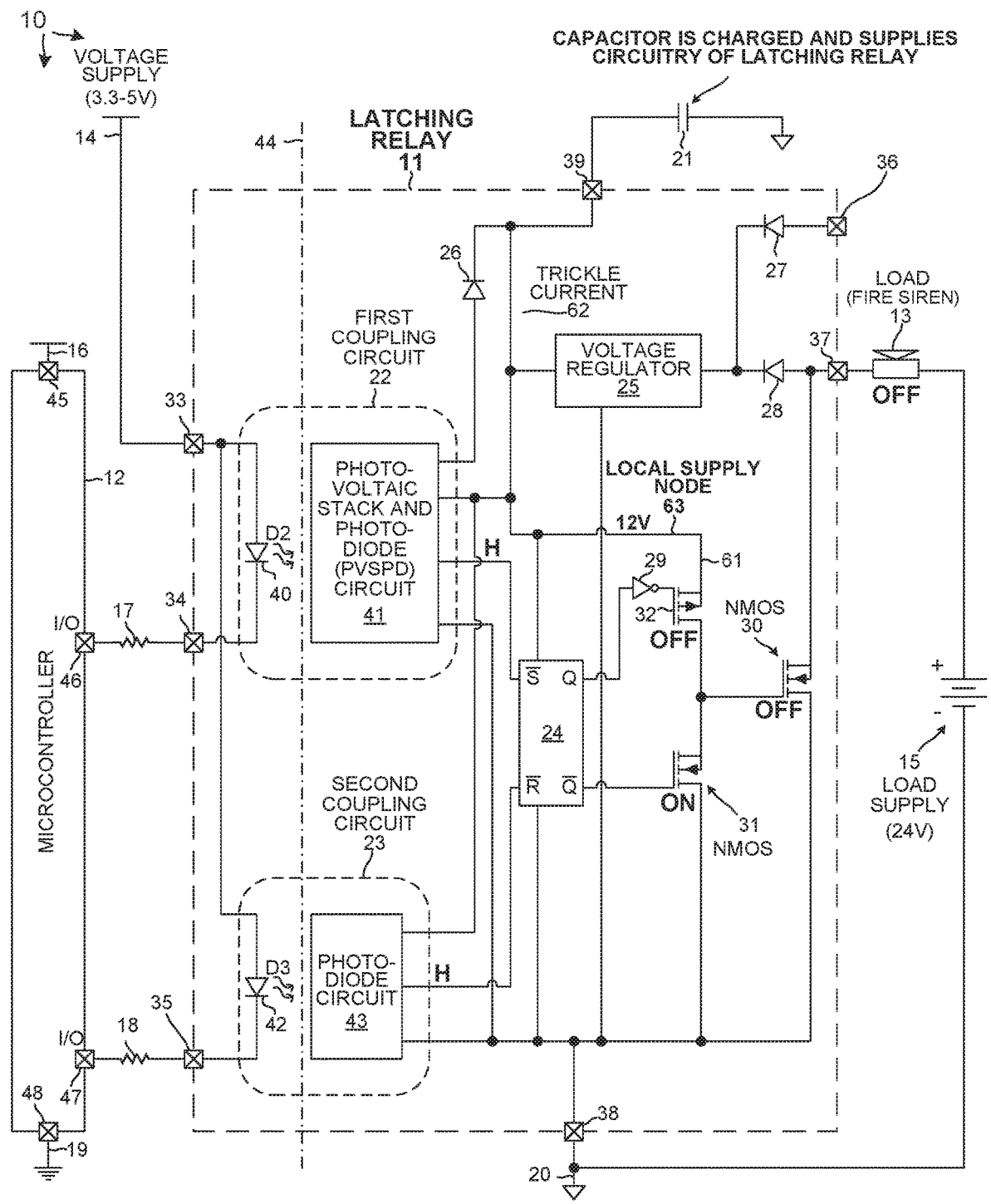
FIG. 4 is a circuit diagram that shows how the capacitor 21 is used to supply a local supply node 63.

FIG. 4 is a circuit diagram that shows how the capacitor 21 is used to supply a local supply node 63. The capacitor 21 is coupled to and supplies the local supply node 63 via the storage terminal 39. The local supply node 63, in turn, supplies circuitry of the latching relay 11. The local supply node 63 is coupled to the first coupling circuit 22, to a cathode of the diode 26, to the voltage regulator 25, to a source terminal of the pMOS transistor 32, and to the latch circuit 24. In this example, the capacitor 21 is external to the latching relay 11. The capacitor 21 has one terminal coupled to the storage terminal 39 and another terminal coupled to ground 20. In another example, the conductor 21 is internal and within the latching circuit 11 and no storage terminal is provided with the latching circuit 11.

Figure 5:
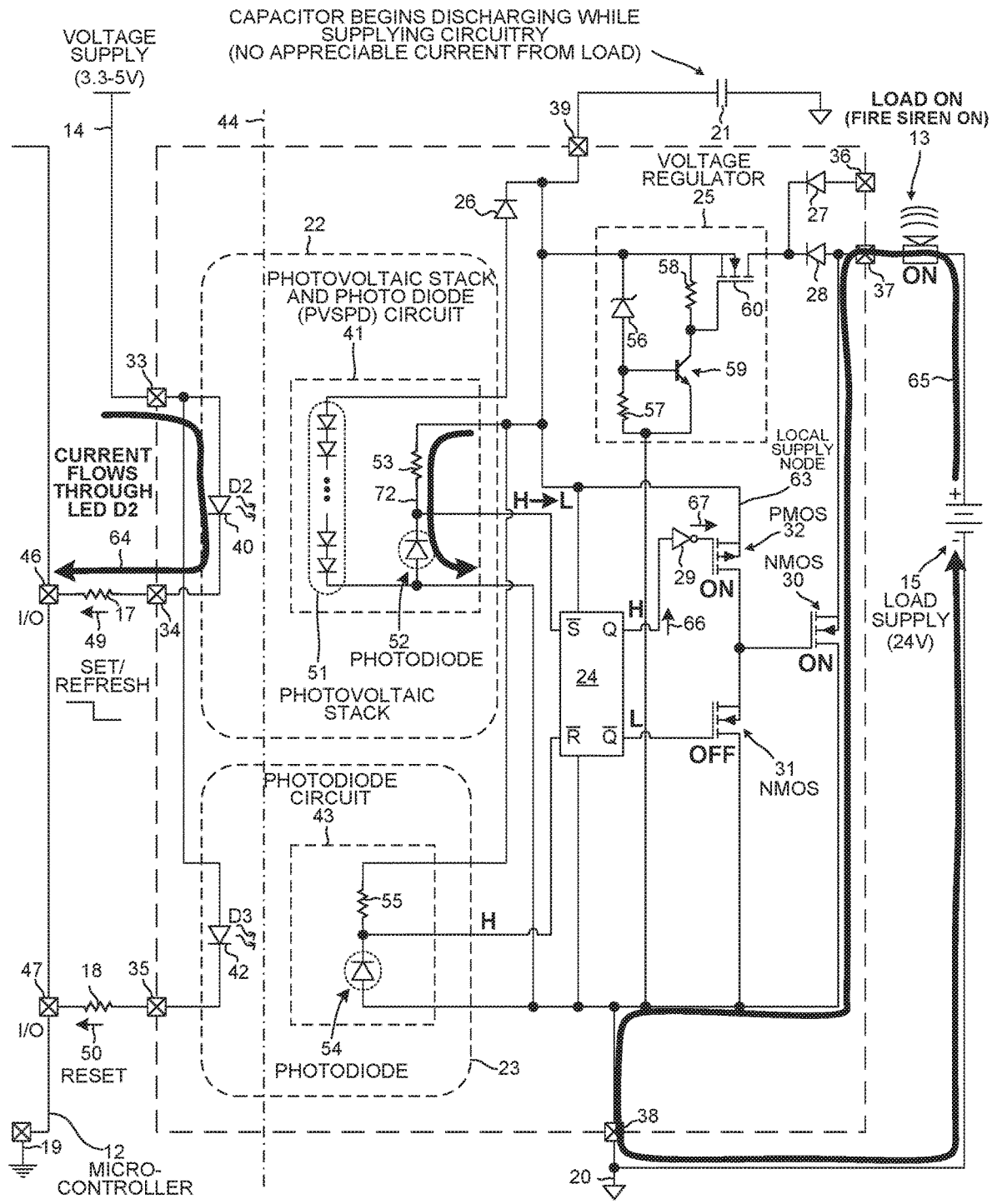
FIG. 5 is a circuit diagram showing how the latching relay is used to enable the load 13.

FIG. 5 is a circuit diagram showing how the latching relay is used to enable the load 13. The microcontroller 12 controls the set/refresh control signal 49 to switch from a digital logic high level to a digital logic low level. When the set/refresh control signal 49 is at a digital logic low level, the first coupling circuit 22 sinks current from the supply node 14. Current flows from the supply node 14, through the LED 40 via supply terminal 33, through resistor 17 via control terminal 34, and onto terminal 46 of the microcontroller 12. Reference numeral 64 represents this flow of current. Current flow through LED 40 causes photodiode 52 to be activated and pulls node 72 low. This in turn sets an S input of latch circuit 24. In response, latch circuit 24 outputs a digital logic high signal 66 on a Q output terminal of the latch circuit 24. Inverter 29 receives and inverts the digital logic high signal 66 and supplies a digital logic low signal 67 onto a gate of the PMOS transistor 32 thereby enabling the PMOS transistor 32. Once PMOS transistor 32 is enabled, the local supply node 63 biases a gate of drive transistor 30 thereby enabling drive transistor 30. After the drive transistor 30 is enabled, the load 13 is switched on and drive current 65 flows from the load supply 15, through load 13, through load terminal 37, through drive transistor 30, and onto a negative terminal of load supply 15 via terminal 38. The set/refresh control signal 49 is switched to a digital logic high level and current stops flowing through LED 40 of the first coupling circuit 22.

While the load 13 is enabled, the capacitor 21 begins to discharge. As the capacitor 21 discharges, the local supply node 63 decreases in voltage. Discharge of capacitor 21 is undesirable because the drive transistor 30 is maintained in a conductive state by supplying the gate of the drive transistor 30 from the local supply node 63. If the capacitor 21 were to discharge to such an extent that the drive transistor 30 were to switch off and no longer be conductive, then the load current 65 would stop flowing and the load 13 would switch off. As explained below with respect to FIG. 6, the latching relay 11 is controlled in a refresh mode thereby re-charging capacitor 21 from the supply terminal 33 and not from the load terminal 37.

Figure 6:
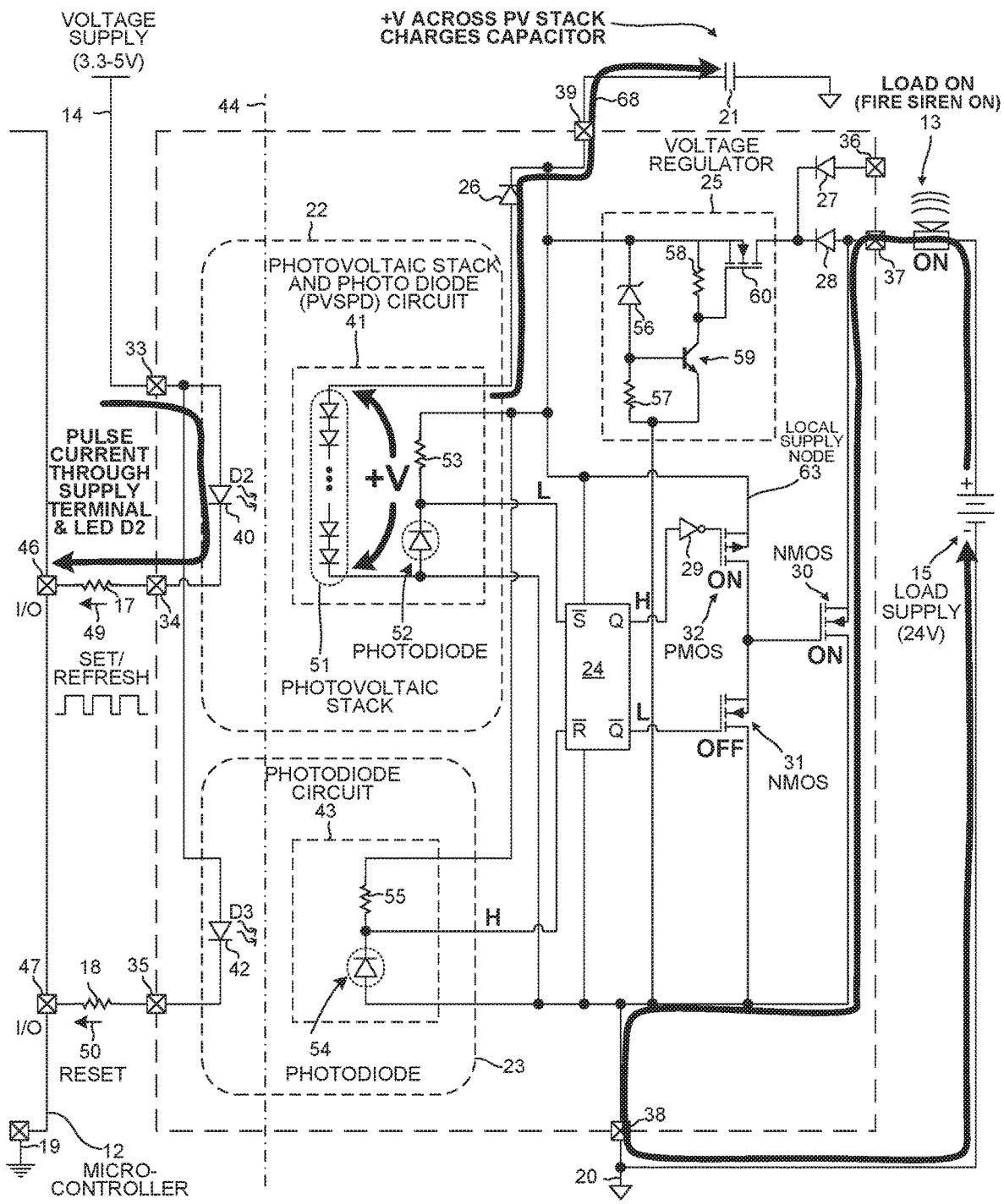
FIG. 6 is a circuit diagram showing how the capacitor 21 is recharged by controlling the latching relay 11 in a refresh mode.

FIG. 6 is a circuit diagram showing how the capacitor 21 is recharged by controlling the latching relay 11 in a refresh mode. To maintain the local supply node 63 above a minimum voltage to maintain drive transistor 30 in a conductive state and to supply other circuitry of the latching relay 11, microcontroller 12 controls the latching relay 11 to operate in a refresh mode. In the refresh mode, the set/refresh control signal 49 is pulsed with a duty cycle of a predetermined fractional amount. In this example, the duty cycle of the set/refresh control signal 49 in the refresh mode is predetermined based on design factors including integrated circuit leakages, external MOSFET leakages, and board leakages.

During the refresh mode, the capacitor 21 is charged from the supply node 14 via the supply terminal 33. The capacitor 21 is not charged from the load supply 15 or from the load terminal 37 in the refresh mode. When the set/refresh control signal 49 is controlled to a digital logic high level in the refresh mode, no current flows through the LED 40 of coupling circuit 22. Neither the LED 40 nor the photovoltaic stack 51 is enabled. Accordingly, the capacitor is not charged when the set/refresh control signal 49 is controlled to a digital logic high level.

When the set/refresh control signal 49 is controlled to a digital logic low level, the LED 40 sinks current from the supply node 14 via the supply terminal 33 onto the control terminal 34. This causes the LED 40 to be enabled and to radiate energy that is absorbed by the photovoltaic stack 51 thereby enabling the photovoltaic stack 51. When the photovoltaic stack 51 is enabled, a voltage +V develops across the photovoltaic stack 51. The voltage +V across the photovoltaic stack 51 charges the capacitor 21 via the diode 26 and storage terminal 39. Reference numeral 68 identifies a current path from the PVSPD circuit 41 that charges the capacitor 21. Accordingly, the capacitor 21 is charged during the low cycle of the set/refresh control signal 49. By operating the refresh mode such that the capacitor remains above the minimum operating voltage level of circuitry within latching relay 11, transistor 30 remains conductive and the load 13 remains enabled.

Figure 7:
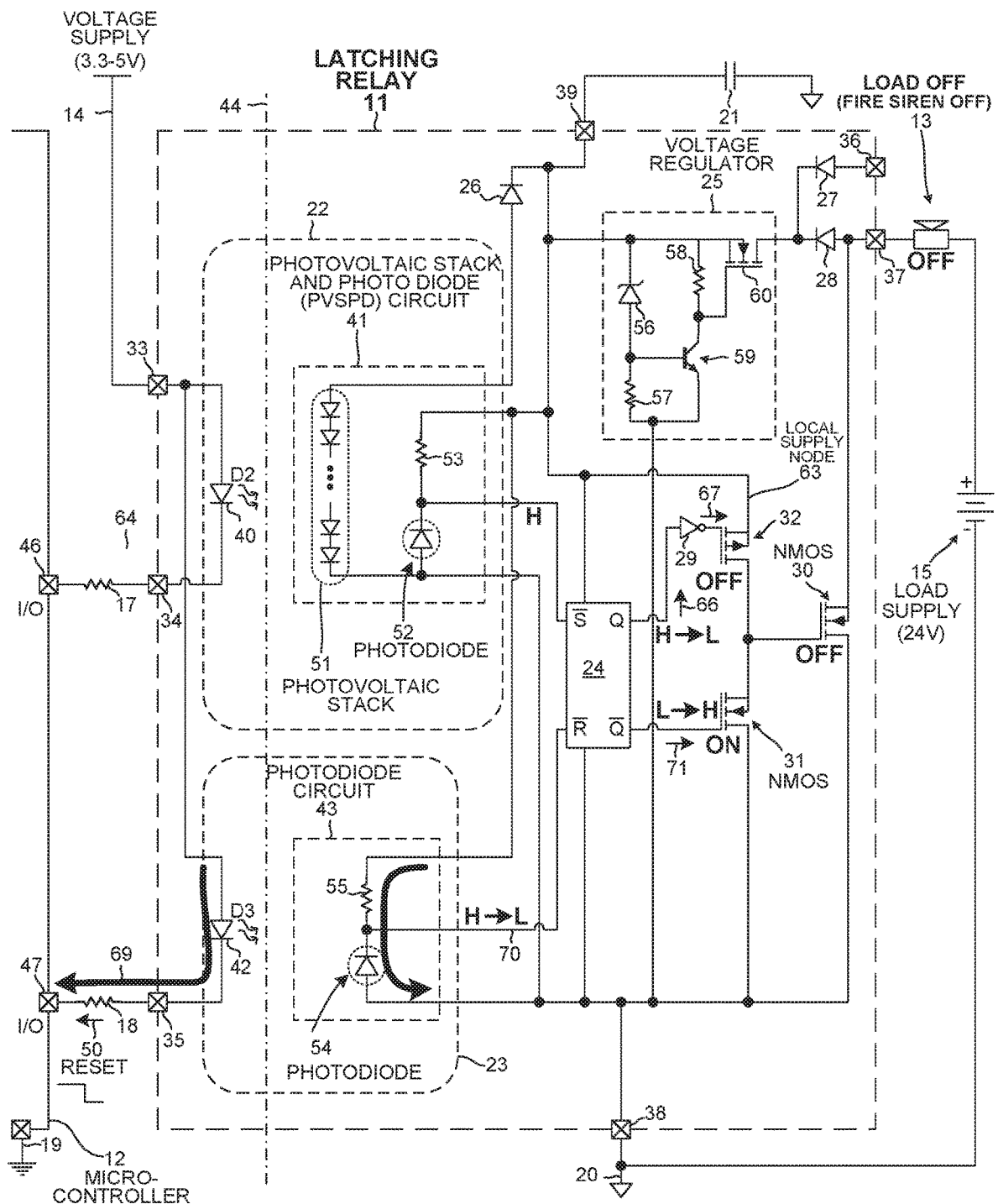
FIG. 7 is a circuit diagram showing how the latching relay switches the load 13 from an enabled state to a disabled state.

FIG. 7 is a circuit diagram showing how the latching relay switches the load 13 from an enabled state to a disabled state. The microcontroller 12 controls the reset control signal 50 to switch from a digital logic high level to a digital logic low level. When the reset control signal 50 is at a digital logic low level, the second coupling circuit 23 sinks current from the supply node 14. Current flows from the supply node 14, through the LED 42 via supply terminal 33, through resistor 18 via control terminal 35, and onto terminal 47 of the microcontroller 12. Reference numeral 69 represents this flow of current. Current flow through LED 42 causes photodiode 54 to be activated and pulls node 70 low. This in turn sets an R input of latch circuit 24. In response, the latch circuit 24 outputs a digital logic low signal 66 on the Q output terminal and outputs a digital logic high signal 71 on the Q output terminal. Inverter 29 receives and inverts the digital logic low signal 66 and supplies a digital logic high signal 67 onto the gate of the PMOS transistor 32 thereby disabling the PMOS transistor 32. The digital logic high signal 71 is supplied onto a gate of the NMOS transistor 31 thereby enabling the NMOS transistor 31. Once NMOS transistor 31 is enabled, the gate of the drive transistor 30 is pulled low via the NMOS transistor 31 thereby disabling drive transistor 30. After the drive transistor 30 is disabled, the load 13 is switched off. The reset control signal 50 is switched to a digital logic high level and current stops flowing through LED 42 of the second coupling circuit 23.

Figure 8:
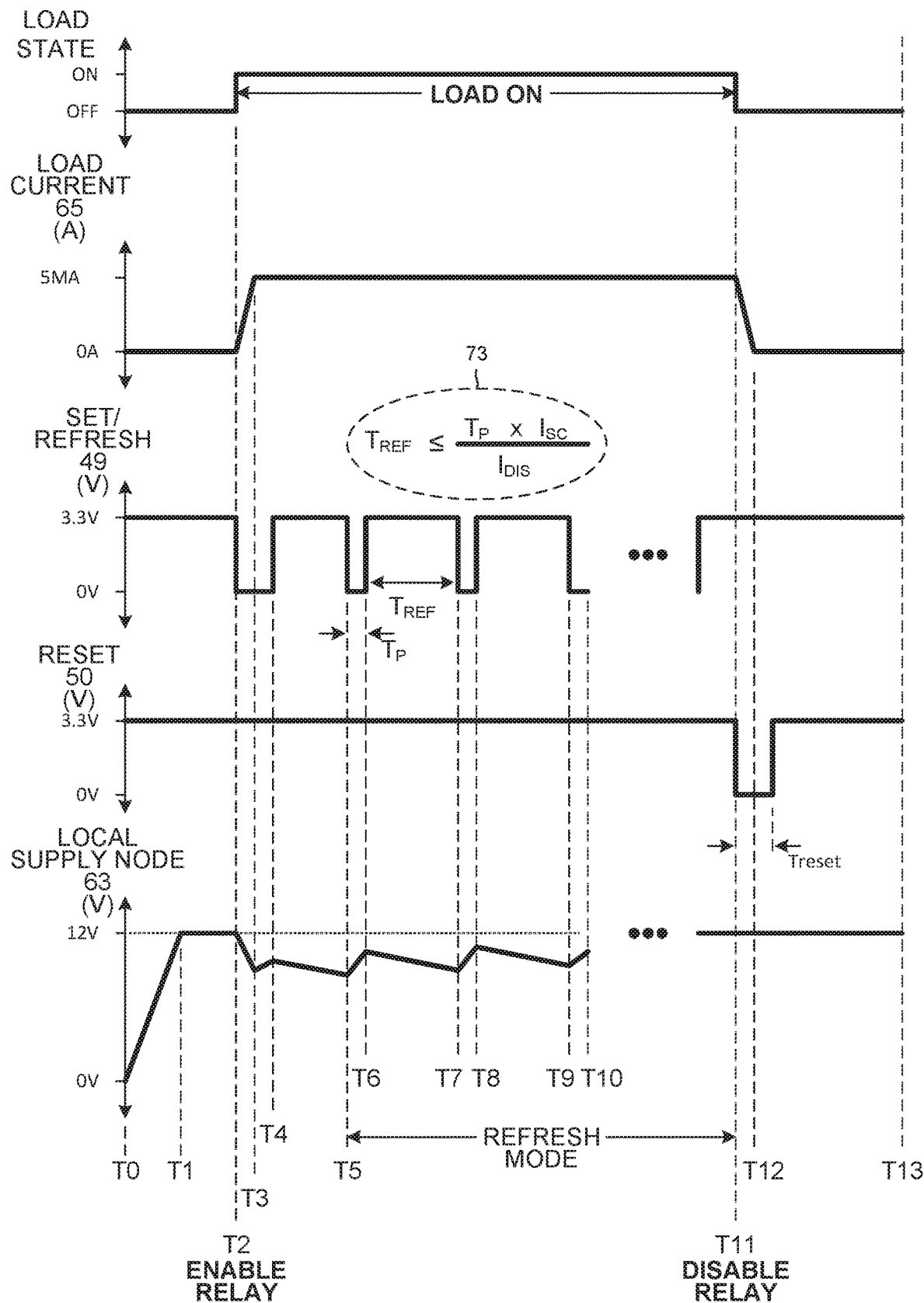
FIG. 8 is a waveform diagram of voltage and current along various nodes of system 10 during operation of latching relay 11.

FIG. 8 is a waveform diagram of voltage and current along various nodes of system 10 during operation of latching relay 11. At time T0, the latching relay is connected to the load 13 as shown in FIG. 3. From time T0 to time T1, the capacitor 21 begins to charge up from trickle current 62. As the capacitor 21 charges up, the voltage on the local supply node 63 begins increasing. At time T1, the capacitor 21 is fully charged as shown in FIG. 4. In this example, when the capacitor 21 is fully charged, the local supply node 63 is at 12.0V. It is appreciated by one of ordinary skill in the art that the voltage of the local supply node 63 is configurable to other voltages depending on the operating characteristics of the capacitor 21 that is selected and upon the load requirements of load 13.

At time T2, the microcontroller 12 controls the latching relay 11 to enable the load 13 as shown in FIG. 5. The set/refresh control signal 49 is switched from a digital logic high level to a digital logic low level which initiates turn on of the load 13. From time T1 to time T4, the load current 65 increases. In this example, the load current 65 reaches 5 mA, but it is appreciated that the load current would reach different current levels depending on the load. Between time T2 and T3, the local supply node 63 decreases due to discharge of the capacitor 21. Between time T3 and T4, the local supply node 63 increases due to LED 40 being enabled which causes the local supply node 63 to be charged.

At time T5, the microcontroller 12 controls the latching relay 11 to operate in the refresh mode. The refresh mode extends from time T5 to time T11. Between time T5 and time T6, the set/refresh control signal 49 is switched from a digital logic high level to a digital logic low level and capacitor 21 is charged thereby causing the voltage on the local supply node 63 to increase. Between time T6 and time T7, the set/refresh control signal 49 is switched from a digital logic low level to a digital logic high level and capacitor 21 is discharged thereby causing the voltage on the local supply node 63 to decrease. This pulsing sequence is repeated as shown across times T8, T9, and T10.

Reference numeral 73 identifies a relationship between the time the set/refresh control signal 49 is low ($T_P$) and the time the set/refresh control signal 49 is high ($T_{REF}$) in one example embodiment. Current $I_{SC}$ represents the current available to charge the capacitor from the photovoltaic stack 51 when the set/refresh control signal 49 is low. Current $I_{DIS}$ represents current consumed when the set/refresh control signal 49 is high and the capacitor 21 is discharging. Relationship 73 is required to prevent the voltage on the local supply node 63 from decreasing below the minimum operating voltage of the latching relay 11.

At time T11, the microcontroller 12 controls the latching relay 11 to disable the load 13. The reset control signal 50 is switched from a digital logic high level to a digital logic low level which initiates turn off of the load 13. From time T11 to time T12, the load current 65 decreases until it reaches zero. After time T11, the load 13 is disabled and off.

Figure 9:
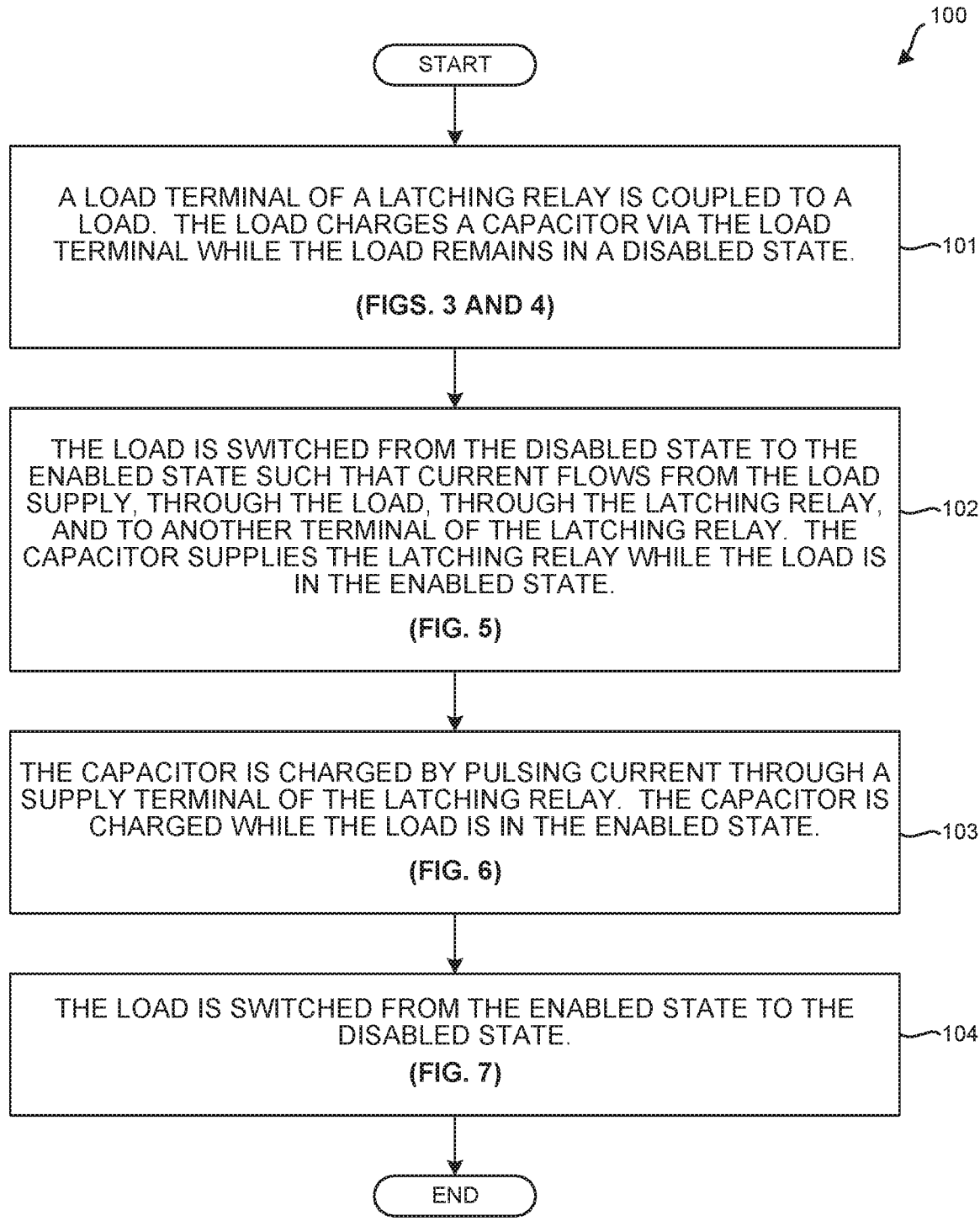
FIG. 9 is a flowchart of a method 100 in accordance with one novel aspect.

FIG. 9 is a flowchart of a method 100 in accordance with one novel aspect.

In a first step (step 101), a load terminal of a latching relay is coupled to a load. The load charges a capacitor via the load terminal while the load remains in a disabled state. In FIG. 3, for example, the latching relay 11 is connected to the load 13 via the load terminal 37. The load 13 is off and the siren is not ringing. The load 13 is supplied by the load supply 15. The latching relay 11 is coupled to the voltage supply 14 via supply node 33. The latching relay 11 is controlled by the microcontroller 12 via the control terminals 34 and 35. The capacitor 21 supplies the local supply node 63 via the storage terminal 39. As shown in FIG. 4, the capacitor 21 begins to discharge as circuitry of the latching relay is supplied by the local supply node 63.

In a second step (step 102), the load is switched from the disabled state to the enabled state such that current flows from the load supply, through the load, through the latching relay, and to another terminal of the latching relay. The capacitor supplies the latching relay while the load is in the enabled state. In the example of FIG. 5, the microcontroller 12 controls the latching relay 11 to enable the load 13 by driving the set/refresh control signal 49 to a digital logic low level. The drive transistor 30 is enabled and the load 13 is switched on causing the siren to ring. Current flows from the load supply 15, through load 13, through load terminal 37, through a source of transistor 30, and to the negative terminal of the load supply 15 via the return terminal 38.

In a third step (step 103), the capacitor is charged by pulsing current through a supply terminal of the latching relay. The capacitor is charged while the load is in the enabled state. In the example of FIG. 6, the microcontroller 12 controls the latching relay 11 to operate in the refresh mode by pulsing the set/refresh control signal 49. The set/refresh control signal 49 is pulsed in accordance with a pre-determined duty cycle. Pulsing the set/refresh control signal 49 causes current to sink through LED 40 and results in LED 40 radiating energy onto photovoltaic stack 51. A voltage V+ develops across the photovoltaic stack 51 that charges the capacitor 21 via diode 26 and storage terminal 39.

In a fourth step (step 104), the load is switched from the enabled state to the disabled state. For example, the microcontroller 12 controls the latching relay 11 to disable the load 13 by driving the reset signal 50 to a digital logic low level. The drive transistor 30 is disabled and the load 13 is switched off causing the siren to stop ringing.

Figure 10:
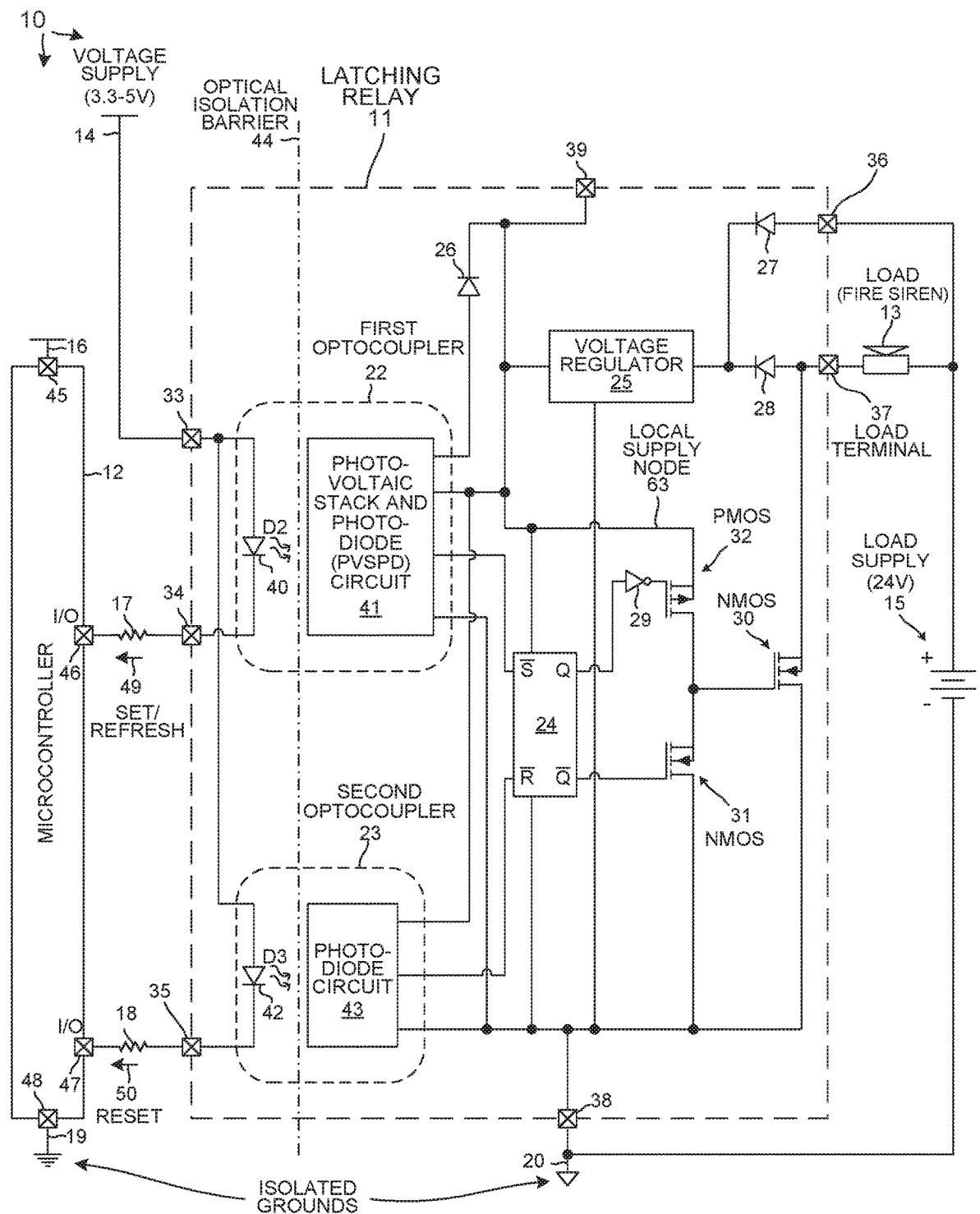
FIG. 10 is a circuit diagram of another configuration of latching relay 11 where the load supply 15 is directly coupled to the load supply terminal 36 thereby avoiding the need for capacitor 21 or for refresh mode operation.

FIG. 10 is a circuit diagram of another configuration of latching relay 11 where the load supply 15 is directly coupled to the load supply terminal 36 thereby avoiding the need for capacitor 21 or for refresh mode operation. When the load supply is accessible, such as in the example of FIG. 10, the load supply 15 is directly connected to the latching relay 11 and no capacitor, such as capacitor 21 of FIG. 1, is needed. In the configuration of FIG. 10, the latching relay 11 need not operate in the refresh mode when the latching relay 11 is latched on because the local supply node 63 is supplied from the load supply 15. When latching relay 11 is latched on, current flows from the load supply 15, through load supply terminal 36, and onto voltage regulator 25 via diode 27. Voltage regulator 25 in turn supplies the local supply node 63. As long as there is sufficient energy stored in the load supply 15 to maintain the local supply node 63 above the minimum operating voltage level, then the latching relay 11 will remain enabled and the load 13 will remain on.

Figure 11:
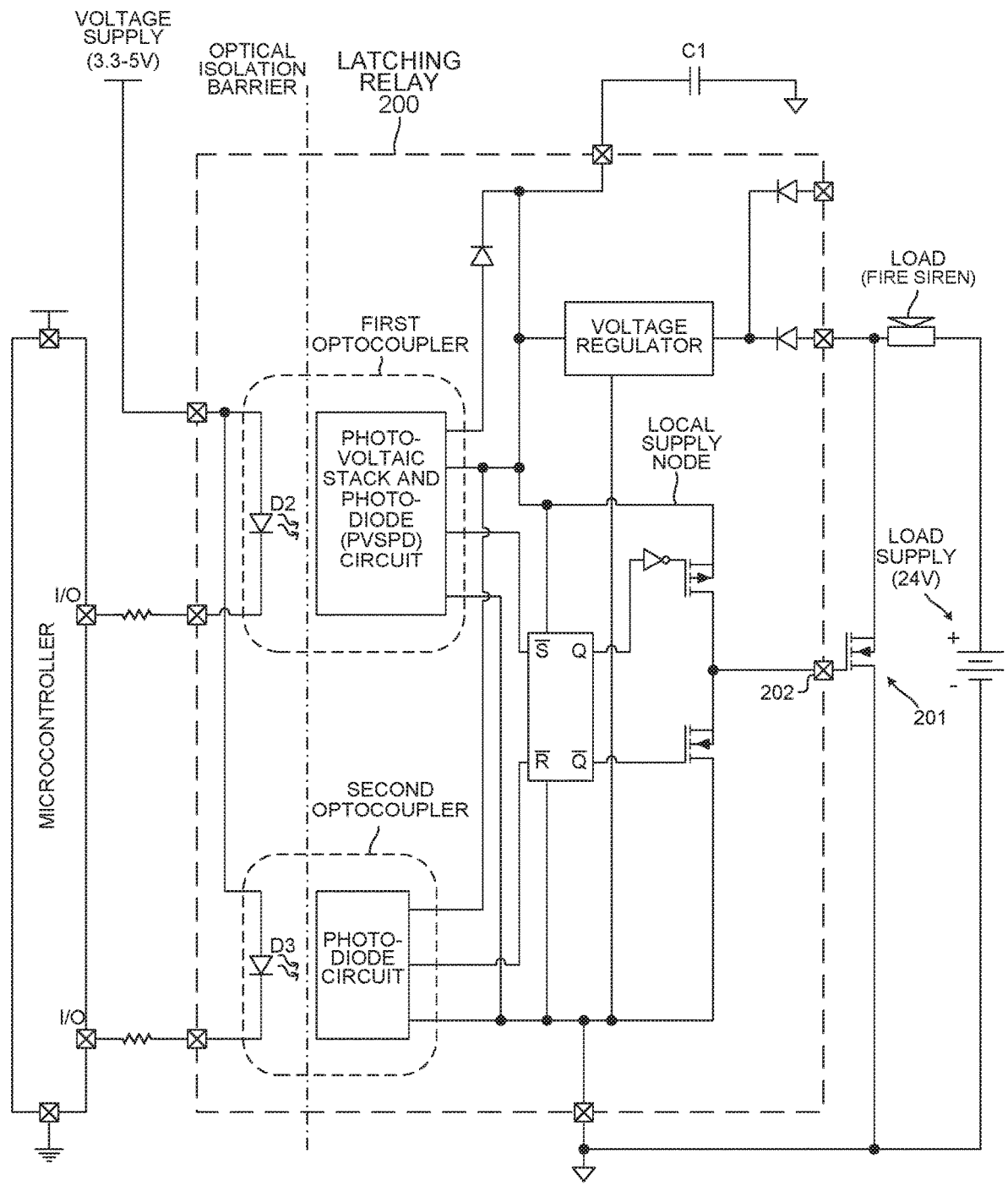
FIG. 11 is a circuit diagram of another embodiment of a packaged latching relay 200 where drive transistor 201 is outside of the latching relay.

FIG. 11 is a circuit diagram of another embodiment of a packaged latching relay 200 where drive transistor 201 is outside of the latching relay. The packaged latching relay 200 of FIG. 11 has substantially the same structure as the latching relay 11 of FIG. 1 except that the drive transistor 201 is outside of the packaged latching relay 200. In this example, packaged latching relay 200 includes a drive terminal 202 that drives a gate of the transistor 201. The packaged latching relay 200 of FIG. 11 operates in substantially the same way as the latching relay 11 of FIG. 1, but the packaged latching relay 200 is smaller and cheaper to manufacture due to the one less transistor disposed within the package. In addition, the packaged latching relay 200 offers flexibility in that the packaged latching relay 200 is configurable to drive a wide variety of drive transistors.

Although certain specific embodiments are described above for instructional purposes, the teachings of this patent document have general applicability and are not limited to the specific embodiments described above. Accordingly, various modifications, adaptations, and combinations of various features of the described embodiments can be practiced without departing from the scope of the invention as set forth in the claims.

What is claimed is:

1. A packaged electronic device comprising:
a supply terminal;
a load terminal;
a first coupling circuit;
a second coupling circuit;
a first transistor having a first terminal, a second terminal, and a third terminal;
a second transistor having a first terminal, a second terminal, and a third terminal, wherein the third terminal of the first transistor is coupled to the second terminal of the second transistor;
a latch circuit having a first terminal and a second terminal, wherein the first terminal of the latch circuit is coupled to the first coupling circuit, and wherein the second terminal of the latch circuit is coupled to the second coupling circuit, wherein the first coupling circuit is operable to configure the latch circuit such that the conductivities of the first transistor and the second transistor are switched thereby causing current to flow through a load coupled to the load terminal, and wherein the second coupling circuit is operable to configure the latch circuit such that the conductivities of the first transistor and the second transistor are switched thereby causing current to stop flowing through the load;
a storage terminal, wherein the packaged electronic device is configurable such that a capacitor is coupled to the storage terminal;
a first diode having a first terminal and a second terminal, wherein the first terminal of the first diode is coupled to the first coupling circuit, and wherein the second terminal of the first diode is coupled to the storage terminal;
a second diode having a first terminal and a second terminal, wherein the first terminal of the second diode is coupled to the load terminal; and
a regulator circuit having a first terminal, a second terminal, and a third terminal, wherein the first terminal of the regulator circuit is coupled to the storage terminal, wherein the first terminal of the regulator circuit is coupled to the second terminal of the first diode, wherein the second terminal of the regulator circuit is coupled to the second terminal of the second diode, and wherein the third terminal of the regulator circuit is coupled to a ground terminal of the packaged electronic device.

2. The packaged electronic device of claim 1, wherein the packaged electronic device does not include any silicon-controlled rectifier (SCR) devices or any mechanical relays, and wherein the latch circuit is coupled to the first coupling circuit via optical coupling, inductive coupling, or capacitive coupling.

3. The packaged electronic device of claim 1, wherein the packaged electronic device is a packaged optically isolated latching relay, and wherein the supply terminal and the load terminal are package terminals of the packaged optically isolated latching relay.

4. The packaged electronic device of claim 1, wherein the second coupling circuit comprises:
a light emitting diode having a first terminal and second terminal, wherein the second terminal of the light emitting diode is coupled to a control terminal of the packaged electronic device; and
a photo diode circuit.

5. A packaged electronic device comprising:
a supply terminal;
a load terminal;
a first coupling circuit;
a second coupling circuit;
a first transistor having a first terminal, a second terminal, and a third terminal;
a second transistor having a first terminal, a second terminal, and a third terminal, wherein the third terminal of the first transistor is coupled to the second terminal of the second transistor; and
a latch circuit having a first terminal and a second terminal, wherein the first terminal of the latch circuit is coupled to the first coupling circuit, and wherein the second terminal of the latch circuit is coupled to the second coupling circuit, wherein the first coupling circuit is operable to configure the latch circuit such that the conductivities of the first transistor and the second transistor are switched thereby causing current to flow through a load coupled to the load terminal, and wherein the second coupling circuit is operable to configure the latch circuit such that the conductivities of the first transistor and the second transistor are switched thereby causing current to stop flowing through the load,
wherein the latch circuit also has a third terminal and a fourth terminal, wherein the third terminal of the latch circuit is coupled to the first terminal of the first transistor via an inverter, and wherein the fourth terminal of the latch circuit is coupled to the first terminal of the second transistor.

6. The packaged electronic device of claim 5, wherein the packaged electronic device does not include any silicon-controlled rectifier (SCR) devices or any mechanical relays, and wherein the latch circuit is coupled to the first coupling circuit via optical coupling, inductive coupling, or capacitive coupling.

7. The packaged electronic device of claim 5, wherein the packaged electronic device is a packaged optically isolated latching relay, and wherein the supply terminal and the load terminal are package terminals of the packaged optically isolated latching relay.

8. The packaged electronic device of claim 5, wherein the second coupling circuit comprises:
a light emitting diode having a first terminal and second terminal, wherein the second terminal of the light emitting diode is coupled to a control terminal of the packaged electronic device; and
a photo diode circuit.

9. A packaged electronic device comprising:
a supply terminal;
a load terminal;
a first coupling circuit;
a second coupling circuit;
a first transistor having a first terminal, a second terminal, and a third terminal;
a second transistor having a first terminal, a second terminal, and a third terminal, wherein the third terminal of the first transistor is coupled to the second terminal of the second transistor; and
a latch circuit having a first terminal and a second terminal, wherein the first terminal of the latch circuit is coupled to the first coupling circuit, and wherein the second terminal of the latch circuit is coupled to the second coupling circuit, wherein the first coupling circuit is operable to configure the latch circuit such that the conductivities of the first transistor and the second transistor are switched thereby causing current to flow through a load coupled to the load terminal, and wherein the second coupling circuit is operable to configure the latch circuit such that the conductivities of the first transistor and the second transistor are switched thereby causing current to stop flowing through the load, wherein the first coupling circuit comprises:

a light emitting diode having a first terminal and second terminal, wherein the first terminal of the light emitting diode is coupled to the supply terminal, and wherein the second terminal of the light emitting diode is coupled to a control terminal of the packaged electronic device; and a photovoltaic stack and photo diode circuit.

10. The packaged electronic device of claim 9, wherein the packaged electronic device does not include any silicon-controlled rectifier (SCR) devices or any mechanical relays, and wherein the latch circuit is coupled to the first coupling circuit via optical coupling, inductive coupling, or capacitive coupling.

11. The packaged electronic device of claim 9, wherein the packaged electronic device is a packaged optically isolated latching relay, and wherein the supply terminal and the load terminal are package terminals of the packaged optically isolated latching relay.

12. The packaged electronic device of claim 9, wherein the second coupling circuit comprises:

a light emitting diode having a first terminal and second terminal, wherein the second terminal of the light emitting diode is coupled to a control terminal of the packaged electronic device; and a photo diode circuit.

* * * * *